United States Patent
Seki

(10) Patent No.: US 8,654,554 B2
(45) Date of Patent: Feb. 18, 2014

(54) SEMICONDUCTOR DEVICE

(75) Inventor: Shinsei Seki, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 26 days.

(21) Appl. No.: 13/548,209

(22) Filed: Jul. 13, 2012

(65) Prior Publication Data

US 2013/0016548 A1    Jan. 17, 2013

(30) Foreign Application Priority Data

Jul. 14, 2011    (JP) .................... 2011-155296

(51) Int. Cl.
*H02M 7/537*    (2006.01)

(52) U.S. Cl.
USPC .................... 363/141; 363/132; 361/688

(58) Field of Classification Search
USPC ............... 363/131, 132, 141; 361/688, 711
See application file for complete search history.

(56) References Cited

U.S. PATENT DOCUMENTS

| | | | |
|---|---|---|---|
| 5,929,665 A * | 7/1999 | Ichikawa et al. | 327/109 |
| 6,215,679 B1 * | 4/2001 | Yamane et al. | 363/132 |
| 7,515,447 B2 * | 4/2009 | Ronkainen et al. | 363/141 |
| 7,605,456 B2 * | 10/2009 | Obu et al. | 257/680 |
| 2012/0307541 A1 * | 12/2012 | Shimoike et al. | 363/132 |

FOREIGN PATENT DOCUMENTS

| | | |
|---|---|---|
| JP | 2010-016947 | 1/2010 |
| JP | 2010-178523 | 8/2010 |
| JP | 2011-114176 | 6/2011 |

OTHER PUBLICATIONS

Japanese Office Action for corresponding JP Application No. 2011-155296, Jun. 11, 2013.

* cited by examiner

*Primary Examiner* — Jessica Han
(74) *Attorney, Agent, or Firm* — Ditthavong Mori & Steiner, P.C.

(57) ABSTRACT

A semiconductor device includes at least one arm series circuit, a conductive first thermal buffer member, and a conductive second thermal buffer member. The arm series circuit includes an upper arm, a lower arm, a positive-electrode terminal, a negative-electrode terminal, and an output terminal. The first thermal buffer member has a linear expansion coefficient greater than a linear expansion coefficient of the first switching device and smaller than a linear expansion coefficient of one of the positive-electrode terminal and the output terminal. The second thermal buffer member has a linear expansion coefficient greater than a linear expansion coefficient of the second switching device and smaller than a linear expansion coefficient of one of the negative-electrode terminal and the output terminal.

17 Claims, 8 Drawing Sheets

SEMICONDUCTOR DEVICE

CROSS-REFERENCE TO RELATED APPLICATIONS

The present application claims priority under 35 U.S.C. §119 to Japanese Patent Application No. 2011-155296, filed Jul. 14, 2011, entitled "Semiconductor Device." The contents of this application are incorporated herein by reference in their entirety.

BACKGROUND OF THE INVENTION

1. Field of the Invention

The disclosure relates to a semiconductor device.

2. Discussion of the Background

There has been developed a semiconductor device including an arm series circuit in which an upper arm and a lower arm each having a switching device and a diode connected in inversely parallel thereto (inversely parallel diode) are connected in series. There are an inverter, a converter, etc. as such a semiconductor device (see, for example, Japanese Unexamined Patent Application Publication No. 2010-016947).

Japanese Unexamined Patent Application Publication No. 2010-016947 describes how to reduce the stray capacitor at the output terminal of a power module, thereby suppressing a charge/discharge current originating from the stray capacitor (see ABSTRACT of the publication). The stray capacitor generates a common-mode current, bringing about conduction noise or radiation noise (see paragraph [0007] of the publication). To deal with the foregoing problem, an electrode 2c which serves as an output terminal is firmly connected to or crimped to the emitter electrode of an IGBT 3a, and an electrode 2c is directly led out from a module 2 as an external electrode in Japanese Unexamined Patent Application Publication No. 2010-016947. Accordingly, the output terminal is directly connected to an external component without an insulating substrate 10 interposed therebetween to reduce the stray capacitor, thereby suppressing a charge/discharge current originating from the stray capacitor (see ABSTRACT of the publication).

SUMMARY OF THE INVENTION

According to one aspect of the present invention, a semiconductor device includes at least one arm series circuit, a conductive first thermal buffer member, and a conductive second thermal buffer member. The arm series circuit includes an upper arm, a lower arm, a positive-electrode terminal, a negative-electrode terminal, and an output terminal. The upper arm has a first switching device and a first diode connected to and provided in inversely parallel with the first switching device. The lower arm has a second switching device and a second diode connected to and provided in inversely parallel with the second switching device. The lower arm is connected in series with the upper arm. The output terminal is disposed between the positive-electrode terminal and the negative-electrode terminal. The first switching device and the first diode are disposed between the positive-electrode terminal and the output terminal. The second switching device and the second diode are disposed between the negative-electrode terminal and the output terminal. The conductive first thermal buffer member is disposed between the first switching device and at least one of the positive-electrode terminal and the output terminal. The first thermal buffer member has a linear expansion coefficient greater than a linear expansion coefficient of the first switching device and smaller than a linear expansion coefficient of one of the positive-electrode terminal and the output terminal. The conductive second thermal buffer member is disposed between the second switching device and at least one of the negative-electrode terminal and the output terminal. The second thermal buffer member has a linear expansion coefficient greater than a linear expansion coefficient of the second switching device and smaller than a linear expansion coefficient of one of the negative-electrode terminal and the output terminal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
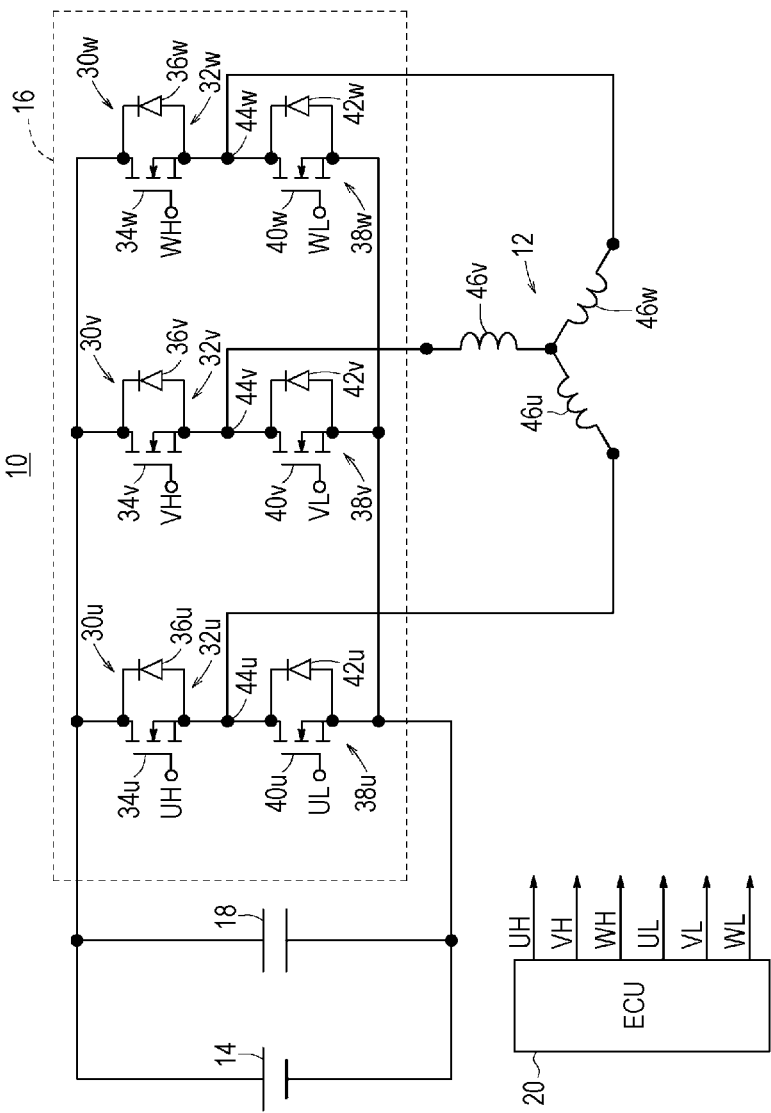
FIG. 1 is a circuit diagram of a drive system in which an inverter as a semiconductor device according to one embodiment of the disclosure is mounted.

The embodiments will now be described with reference to the accompanying drawings, wherein like reference numerals designate corresponding or identical elements throughout the various drawings.

I. One Embodiment

A. Description of Configuration

1. Configuration of Drive System 10

(1-1) General Configuration

FIG. 1 is a circuit diagram of a drive system 10 in which an inverter 16 as a semiconductor device according to one embodiment of the disclosure is mounted.

As shown in FIG. 1, the drive system 10 includes a motor 12, a DC power supply 14 (hereinafter also referred to as "power supply 14"), a capacitor 18, and an electronic control unit 20 (hereinafter also referred to as "ECU 20") in addition to the inverter 16.

(1-2) Motor 12

The motor 12 is of a 3-phase AC brushless type, and is supplied with power from the power supply 14 via the inverter 16 which is controlled by the ECU 20. The motor 12 generates drive force according to the supplied power. The motor 12 may be uses as, for example, a motor for driving a vehicle or a motor for generating assisting force for an electric power steering unit. The motor 12 may also be used for other applications to be described later.

(1-3) DC Power Supply 14

The DC power supply 14 is adequately selected according to the application of the drive system 10, and can be a primary battery or a secondary battery. When the motor 12 is used for an application which needs comparatively high power (e.g., when the motor 12 is used as a motor for driving a vehicle), for example, the power supply 14 can be a lithium ion secondary battery, nickel-metal hydride secondary battery, or an electric storage device (energy storage) such as a capacitor. When the motor 12 is used for an application which needs comparatively low power (e.g., when the motor 12 is used as an electric power steering unit for a vehicle), the power supply 14 can be an electric storage device such as a lead battery.

(1-4) Inverter 16

The inverter 16 is configured as a 3-phase bridge type which performs DC/AC conversion to convert DC power from the power supply 14 to 3-phase AC power, and supplies the AC power to the motor 12.

As shown in FIG. 1, the inverter 16 has 3-phase arm series circuits 30u, 30v and 30w. The U-phase arm series circuit 30u includes an upper arm 32u having an upper switching device 34u (hereinafter referred to as "upper SW device 34u") and an inversely parallel diode 36u (hereinafter referred to as "upper diode 36u"), and a lower arm 38u having a lower switching device 40u (hereinafter referred to as "lower SW device 40u") and an inversely parallel diode 42u (hereinafter referred to as "lower diode 42u").

Likewise, the V-phase arm series circuit 30v includes an upper arm 32v having an upper switching device 34v (hereinafter referred to as "upper SW device 34v") and an inversely parallel diode 36v (hereinafter referred to as "upper diode 36v"), and a lower arm 38v having a lower switching device 40v (hereinafter referred to as "lower SW device 40v") and an inversely parallel diode 42v (hereinafter referred to as "lower diode 42v"). The W-phase arm series circuit 30w includes an upper arm 32w having an upper switching device 34w (hereinafter referred to as "upper SW device 34w") and an inversely parallel diode 36w (hereinafter referred to as "upper diode 36w"), and a lower arm 38w having a lower switching device 40w (hereinafter referred to as "lower SW device 40w") and an inversely parallel diode 42w (hereinafter referred to as "lower diode 42w").

Each of the SW devices 34u, 34v, 34w and the SW devices 40u, 40v, 40w may be configured to include, for example, a single switching device, such as MOSFET (Metal-Oxide-Semiconductor Field-Effect Transistor), or an insulated gate bipolar transistor (IGBT), or a plurality of such switching devices. Likewise, each of the upper diodes 36u, 36v, 36w and the lower diodes 42u, 42v, 42w may be configured to include a single or a plurality of diodes.

Hereinafter, the individual arm series circuits 30u, 30v, 30w are generically called "arm series circuit 30", the individual upper arms 32u, 32v, 32w are generically called "upper arm 32", the individual lower arms 38u, 38v, 38w are generically called "lower arm 38", the individual upper SW devices 34u, 34v, 34w are generically called "upper SW device 34", the individual lower SW devices 40u, 40v, 40w are generically called "lower SW device 40", the individual upper diodes 36u, 36v, 36w are generically called "upper diode 36", and the individual lower diodes 42u, 42v, 42w are generically called "lower diode 42".

In each arm series circuit 30, a central point 44u, 44v, 44w between the upper arm 32u, 32v, 32w and the lower arm 38u, 38v, 38w is coupled to a winding 46u, 46v, 46w of the motor 12. Hereinafter, the central points 44u, 44v, 44w are generically called "central point 44", and the windings 46u, 46v, 46w are generically called "winding 46u, 46v, 46w".

Each upper SW device 34 and each lower SW device 40 are respectively driven by a drive signal UH, VH, WH and a drive signal UL, VL, WL supplied from the ECU 20.

(1-5) ECU 20

The ECU 20 controls the output of the motor 12 based on output values from unillustrated various sensors. The ECU 20 has an input/output section, an operation section and a storage section (none shown) as hardware components.

2. Details of Inverter 16

(2-1) General Configuration

Figure 2:
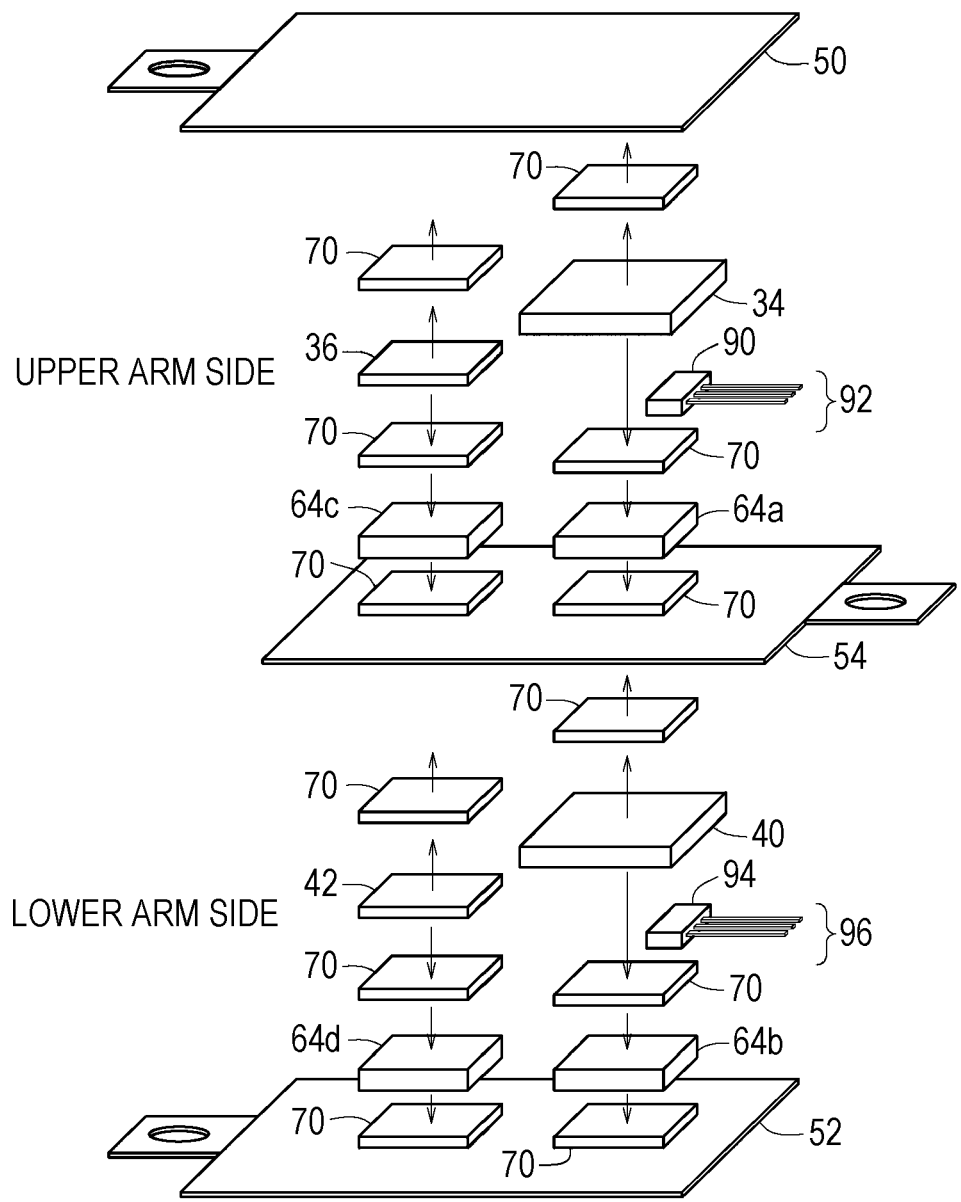
FIG. 2 is a simple exploded perspective view of one arm series circuit included in the inverter.
Figure 3:
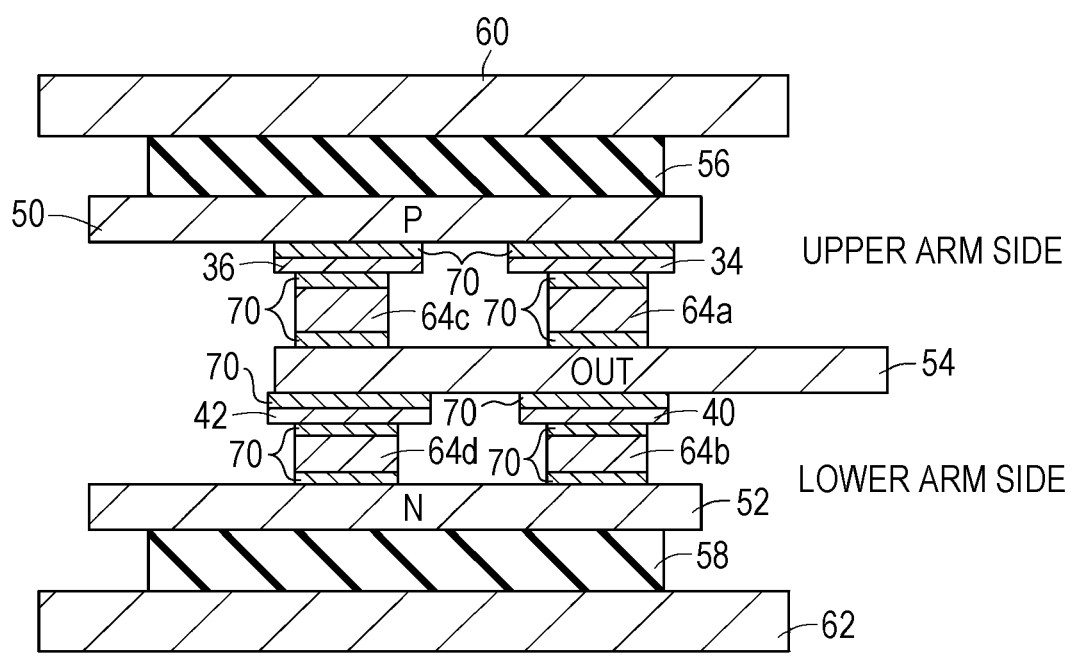
FIG. 3 is a simple cross-sectional view showing one arm series circuit and the periphery thereof.

FIG. 2 is a simple exploded perspective view of one arm series circuit 30. FIG. 3 is a simple cross-sectional view showing one arm series circuit 30 and the periphery thereof. The inverter 16 is configured to have three arm series circuits 30 arranged in parallel (see FIG. 1). In FIG. 3, "P" indicates the positive electrode side, and "N" indicates the negative electrode side.

As shown in FIGS. 2 and 3, the arm series circuit 30 includes a positive-electrode terminal plate 50, a negative-electrode terminal plate 52, and an output terminal plate 54 disposed between the positive-electrode terminal plate 50 and the negative-electrode terminal plate 52. The positive-electrode terminal plate 50, the negative-electrode terminal plate 52 and the output terminal plate 54 are parallel to one another. The upper SW device 34 and the upper diode 36 are disposed between the positive-electrode terminal plate 50 and the output terminal plate 54. The lower SW device 40 and the lower diode 42 are disposed between the negative-electrode terminal plate 52 and the output terminal plate 54.

As shown in FIG. 3, a first heat sink 60 and a second heat sink 62 are disposed on the opposite sides of the positive-electrode terminal plate 50 and the negative-electrode terminal plate 52 to the output terminal plate 54 via a first insulating substrate 56 and a second insulating substrate 58 (not shown in FIG. 2). The first heat sink 60 and the second heat sink 62 serve to cool the inverter 16, and are each connected to a ground GND.

Further, a conductive first thermal buffer member 64a is disposed between the output terminal plate 54 and the upper SW device 34, and a conductive second thermal buffer member 64b is disposed between the negative-electrode terminal plate 52 and the lower SW device 40. A conductive third thermal buffer member 64c is disposed between the output terminal plate 54 and the upper diode 36, and a conductive fourth thermal buffer member 64d is disposed between the negative-electrode terminal plate 52 and the lower diode 42.

As shown in FIGS. 2 and 3, the individual members are connected to one another by solders 70. The connection may be achieved by a connecting scheme such as brazing.

(2-2) Positive-electrode Terminal Plate 50, Negative-electrode Terminal Plate 52 and Output Terminal Plate 54

The positive-electrode terminal plate 50, the negative-electrode terminal plate 52 and the output terminal plate 54 are what is called bus bars (conductive flat plates made of copper, copper alloy, brass or the like), and have relatively high linear expansion coefficients (e.g., 10 to $20 \times 10^{-6}$/° C.). For example, when the positive-electrode terminal plate 50, the negative-electrode terminal plate 52 and the output terminal plate 54 are made of Cu (copper), their linear expansion coefficients are $16.8 \times 10^6$/° C.

(2-3) Upper SW Device 34 and Lower SW Device 40

Figure 4A:
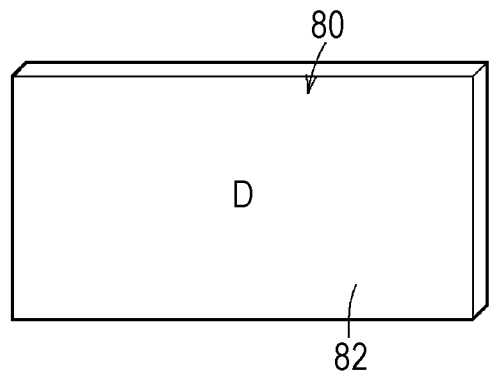
FIG. 4A is an outer configurational diagram providing a simplified illustration of a first surface of the switching device.
Figure 4B:
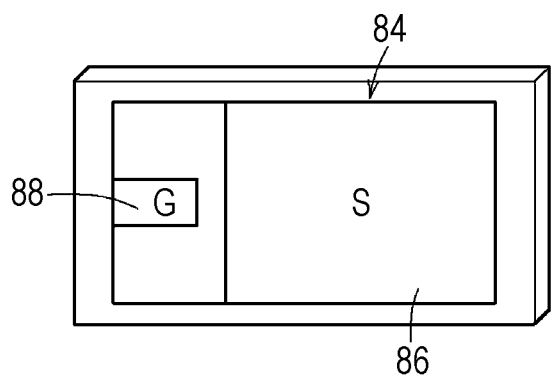
FIG. 4B is an outer configurational diagram providing a simplified illustration of a second surface of the switching device.

According to the embodiment, switching devices of the same specifications (e.g., MOSFETs or IGBTs) are used as the upper SW device 34 and the lower SW device 40. In the upper SW device 34 and the lower SW device 40 according to the embodiment, as shown in FIGS. 4A and 4B, a positive electrode 82 is formed on a first surface 80 (drain surface), and a negative electrode 86 and a gate electrode (control electrode) 88 are formed on a second surface 84 (source surface) opposite to the first surface 80. That is, "D" (drain) in FIG. 4A denotes the positive electrode 82, "S" (source) in FIG. 4B denotes the negative electrode 86, "G" (gate) in FIG. 4B denotes the gate electrode 88.

To distinguish the individual components of the upper SW device 34 and the lower SW device 40, hereinafter, the positive electrode 82, negative electrode 86 and gate electrode 88 of the upper SW device 34 are respectively called "upper positive electrode 82$up$", "upper negative electrode 86$up$", and "upper gate electrode 88$up$", and the positive electrode 82, negative electrode 86 and gate electrode 88 of the lower SW device 40 are respectively called "lower positive electrode 82$low$", "lower negative electrode 86$low$" and "lower gate electrode 88$low$".

Although not illustrated in FIGS. 2 and 3, the upper positive electrode 82$up$ is connected to the positive-electrode terminal plate 50 by the solder 70, and the upper negative electrode 86$up$ is connected to the first thermal buffer member 64$a$ by the solder 70. The upper gate electrode 88$up$ is connected to a signal line 92 via a signal terminal 90 (FIG. 2). The signal line 92 is connected to the ECU 20. Likewise, the lower negative electrode 86$low$ is connected to the second thermal buffer member 64$b$ by the solder 70, and the lower positive electrode 82$low$ is connected to the output terminal plate 54 by the solder 70. The lower gate electrode 88$low$ is connected to a signal line 96 via a signal terminal 94 (FIG. 2). The signal line 96 is connected to the ECU 20.

The upper SW device 34 and the lower SW device 40 each including a component, such as a mold resin, have relatively low equivalent expansion coefficients (e.g., 2 to $4 \times 10^{-6}/° C$.).

(2-4) Upper Diode 36 and Lower Diode 42

According to the embodiment, diodes of the same specifications are used as the upper diode 36 and the lower diode 42. FIG. 3 shows that the anodes of the upper diode 36 and the lower diode 42 are provided on the bottom sides, and the cathodes thereof are provided on the top sides.

The upper diode 36 and the lower diode 42 have relatively low linear expansion coefficients (e.g., 2 to $4 \times 10^{-6}/° C$.)

(2-5) First to Fourth Thermal Buffer Materials 64$a$ to 64$d$

Each of the first to fourth thermal buffer members 64$a$ to 64$d$ is a conductive member that reduces thermal stress originating from the difference between the linear expansion coefficients of a member disposed on its one surface and a member disposed on its other surface. As shown in FIG. 2, the first to fourth thermal buffer members 64$a$ to 64$d$ according to the embodiment are rectangular parallelepipeds. As will be mentioned later, the first to fourth thermal buffer members 64$a$ to 64$d$ may take other shapes.

The first to fourth thermal buffer members 64$a$ to 64$d$ have relatively intermediate linear expansion coefficients (e.g., 2.5 to $10 \times 10^{-6}/° C$.). That is, the linear expansion coefficients of the first to fourth thermal buffer members 64$a$ to 64$d$ are respectively greater than those of the upper SW device 34, the lower SW device 40, the upper diode 36 and the lower diode 42, and smaller than those of the positive-electrode terminal plate 50, the negative-electrode terminal plate 52 and the output terminal plate 54. When the first to fourth thermal buffer members 64$a$ to 64$d$ are made of Mo (molybdenum), for example, their linear expansion coefficients are $5.1 \times 10^{-6}/° C$. When the first to fourth thermal buffer members 64$a$ to 64$d$ are made of W (tungsten), their linear expansion coefficients are $4.5 \times 10^{-6}/° C$. When the first to fourth thermal buffer members 64$a$ to 64$d$ are made of a CuMo composite material, their equivalent expansion coefficients are $7.0 \times 10^{-6}/° C$., for example. When the first to fourth thermal buffer members 64$a$ to 64$d$ are made of a CIC (Cu-Invar-Cu) laminate, their equivalent expansion coefficients are $2.8 \times 10^{-6}/° C$., for example.

As mentioned above, in the upper SW device 34 and the lower SW device 40, the gate electrode 88 is formed on the same second surface 84 on which the negative electrode 86 is formed. In FIG. 3, therefore, the gate electrode 88 is formed on the bottom surface of each of the upper SW device 34 and the lower SW device 40. Therefore, the top surfaces of the first thermal buffer member 64$a$ and the second thermal buffer member 64$b$ contact the surface (second surface 84) on which the gate electrode 88 is formed. As shown in FIGS. 2 and 3, that of the first thermal buffer member 64$a$ and the second thermal buffer member 64$b$ which contacts the surface on which the gate electrode 88 is formed is formed so as to avoid the gate electrode 88 as seen in the laminating direction of the arm series circuit 30.

(2-6) Solder 70

The solder 70 includes a lead-free solder. When the solder 70 is a lead-free solder, any one of SnAgCu (where Sn is tin, Ag is silver and Cu is copper), SnZnBi (where Zn is zinc and Bi is bismuth), SnCu, SnAgInBi (In: indium), and SnZnAl (Al: aluminum) can be used. The solder 70 has a relatively high linear expansion coefficient (e.g., 20 to $60 \times 10^{-6}/° C$.).

Although the solders 70 are disposed on the top surface side and the bottom surface side of each of the upper SW device 34 and the lower SW device 40 in FIGS. 2 and 3, the solders 70 may be disposed on the side surface sides. In addition, a wax having a higher melting point may be used in place of the solder 70.

B. Stray Capacitance

Figure 5:
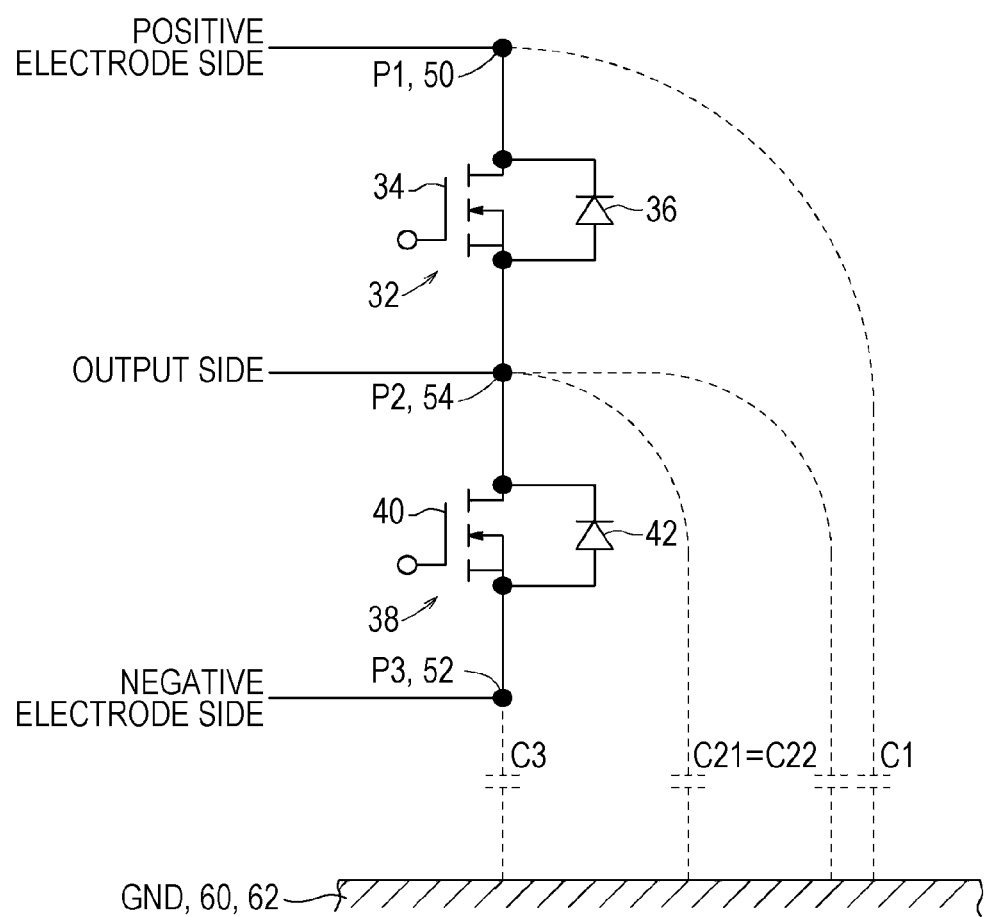
FIG. 5 is a circuit diagram showing stray capacitors at a plurality of points in one arm series circuit to which attention is paid.

FIG. 5 is a circuit diagram showing stray capacitors C1, C21, C22, C3 at a plurality of points P1 to P3 in one arm series circuit 30 to which attention is paid. Referring mainly to FIGS. 3 and 5, the stray capacitors C1, C21, C22, C3 at the points P1 to P3 will be discussed hereinafter.

When the arm series circuit 30 is operated, the stray capacitors C1, C21, C22, C3 may be produced between the points P1 to P3 and the ground GND (first heat sink 60 and second heat sink 62). C1 is the stray capacitor between the point P1 (positive-electrode terminal plate 50) and the first heat sink 60. C21 is the stray capacitor between the point P2 (output terminal plate 54) and the first heat sink 60, and C22 is the stray capacitor between the point P2 (output terminal plate 54) and the second heat sink 62. The stray capacitor C2 is the combination of the stray capacitors C21 and C22. C3 is the stray capacitor between the point P3 (negative-electrode terminal plate 52) and the second heat sink 62. It is to be noted that the stray capacitor between the point P1 (positive-electrode terminal plate 50) and the second heat sink 62, and the stray capacitor between the point P3 (negative-electrode terminal plate 52) and the first heat sink 60 are too small to be neglected.

The presence of those stray capacitors C1 to C3 may cause noise to be transferred to the common side (power supply 14 side or another device side) via the ground GND (first heat sink 60 or second heat sink 62) at the time of switching the upper SW device 34 and the lower SW device 40, resulting in occurrence of conduction noise and radiation noise. (The mechanism of generating conduction noise and radiation noise are described in, for example, paragraphs [0008] and [0009] of Japanese Unexamined Patent Application Publication No. 2007-181351 the entire contents of which are incorporated herein by reference.)

In general, an impedance Xc of a capacitor is acquired from the following equation 1.

$$Xc = 1/(j\omega C) \quad (1)$$

where j is an imaginary unit, $\omega$ is an angular frequency [Hz], and C is a capacitor [F].

The equation 1 shows that in case of the arm series circuit 30, when the switching frequency [Hz] of the upper SW device 34 and the lower SW device 40 becomes higher, it becomes easier for the current flow through the stray capacitors C1 to C3, but reducing the capacitance C can make it harder for the current to flow through the stray capacitors C1 to C3. In particular, because a common-mode current Icom which flows to the common side from the stray capacitor C2 between the point P2 where switching causes a potential variation, and the ground GND, it is important to make the impedance of the stray capacitor C2.

Generally, the capacitance C [F] between parallel plates (electrode plates) is given by the following equation 2.

$$C = \epsilon_0 \cdot \epsilon_S \cdot (S/d) \quad (2)$$

where $\epsilon_0$ is a dielectric constant of vacuum [F/m], $\epsilon_S$ is a relative dielectric constant, S is the area [m$^2$] of the parallel plate, and d is a gap [m] between the parallel plates (electrode plates). The equation 2 shows that the greater the gap d between the parallel plates (electrode plates), the smaller the capacitance C becomes.

The output terminal plate 54 is disposed via the first to fourth thermal buffer members 64a to 64d according to the embodiment, so that the distance between the output terminal plate 54 and the first heat sink 60 (ground GND), and the distance between the output terminal plate 54 and the second heat sink 62 (ground GND) become long as compared to the case where the output terminal plate 54 is disposed without the first to fourth thermal buffer members 64a to 64d. Therefore, the distance (corresponding to the gap d) between the output terminal plate 54 and the ground GND (first heat sink 60 and second heat sink 62) becomes greater. It is therefore apparent from the equation 2 that the stray capacitor C2 becomes relatively small. When the stray capacitor C2 becomes relatively small, the impedance Xc becomes relatively large as apparent from the equation 1. As a result, the common-mode current Icom can be made smaller, making it possible to suppress conduction noise and radiation noise originating from the common-mode current Icom.

C. Influence of Heat from Upper SW Device 34, Lower SW Device 40, Upper Diode 36 and Lower Diode 42

According to the embodiment, as described above, the first thermal buffer member 64a is disposed between the output terminal plate 54 and the upper SW device 34, the second thermal buffer member 64b is disposed between the negative-electrode terminal plate 52 and the lower SW device 40, the third thermal buffer member 64c is disposed between the output terminal plate 54 and the upper diode 36, and the fourth thermal buffer member 64d is disposed between the negative-electrode terminal plate 52 and the lower diode 42. Further, the linear expansion coefficients of the first to fourth thermal buffer members 64a to 64d are greater than the linear expansion coefficients of the upper SW device 34, the lower SW device 40, the upper diode 36 and the lower diode 42, and are smaller than the linear expansion coefficients of the positive-electrode terminal plate 50, the negative-electrode terminal plate 52 and the output terminal plate 54.

When the upper SW device 34 generates heat due to the switching operation, therefore, the presence of the first thermal buffer member 64a makes it hard to transfer heat from the upper SW device 34 to the output terminal plate 54. When the lower SW device 40 generates heat due to the switching operation, the presence of the second thermal buffer member 64b makes it hard to transfer heat from the lower SW device 40 to the negative-electrode terminal plate 52. When the current flows through the upper diode 36, generating heat from the upper diode 36, the presence of the third thermal buffer member 64c makes it hard to transfer heat from the upper diode 36 to the output terminal plate 54. When the current flows through the lower diode 42, generating heat from the lower diode 42, the presence of the fourth thermal buffer member 64d makes it hard to transfer heat from the lower diode 42 to the negative-electrode terminal plate 52. Accordingly, it is possible to suppress the thermal expansion of the negative-electrode terminal plate 52 and the output terminal plate 54.

In addition, when the negative-electrode terminal plate 52 and the output terminal plate 54 expand due to the heats from the upper SW device 34, the lower SW device 40, the upper diode 36 and the lower diode 42, thermal stress originating from the difference in thermal expansion of the upper SW device 34, the lower SW device 40, the upper diode 36 and the lower diode 42 is reduced by the first to fourth thermal buffer members 64a to 64d. Because the solder 70, which is relatively soft, is disposed between each of the upper SW device 34, the lower SW device 40, the upper diode 36 and the lower diode 42, and each of the negative-electrode terminal plate 52 and the output terminal plate 54, the solder 70 can also relax thermal stress.

D. Advantages of Embodiment

According to the embodiment as described above, the first thermal buffer member 64a is disposed between the output terminal plate 54 and the upper SW device 34. Accordingly, the distance between the upper SW device 34 and the first heat sink 60 (ground GND) becomes greater by the thickness of the first thermal buffer member 64a. As a result, the stray capacitor C21 between the output terminal plate 54 and the first heat sink 60 can be reduced. This makes it possible to reduce the common-mode current Icom originating from the stray capacitor C21, thereby suppressing conduction noise and radiation noise originating from the common-mode current Icom.

Likewise, the second thermal buffer member 64b is disposed between the negative-electrode terminal plate 52 and the lower SW device 40. Accordingly, the distance between the lower SW device 40 and the second heat sink 62 (ground GND) becomes greater by the thickness of the second thermal buffer member 64b. As a result, the stray capacitor C22 between the output terminal plate 54 and the second heat sink 62 can be reduced. This makes it possible to reduce the common-mode current Icom originating from the stray capacitor C22, thereby suppressing conduction noise and radiation noise originating from the common-mode current Icom.

According to the embodiment, the linear expansion coefficient of the first thermal buffer member 64a is greater than that of the upper SW device 34, and is smaller than that of the output terminal plate 54. When the upper SW device 34 generates heat, therefore, it is possible to relax the concentration of thermal stress occurring at the connected portion of the upper SW device 34 and the output terminal plate 54 due to the difference between the linear expansion coefficients of the upper SW device 34 and the output terminal plate 54, thus making it easier to prevent the inverter 16 from being broken by the thermal stress.

Likewise, the linear expansion coefficient of the second thermal buffer member 64b is greater than that of the lower SW device 40, and is smaller than that of the negative-electrode terminal plate 52. When the lower SW device 40 generates heat, therefore, it is possible to relax the concentration of thermal stress occurring at the connected portion of the lower SW device 40 and the negative-electrode terminal plate 52 due to the difference between the linear expansion coefficients of the lower SW device 40 and the negative-electrode terminal plate 52, thus making it easier to prevent the inverter 16 from being broken by the thermal stress.

According to the embodiment, in each of the upper SW device 34 and the lower SW device 40, the positive electrode 82 is formed on the first surface 80, the negative electrode 86 is formed on the second surface 84 opposite to the first surface 80, and the gate electrode 88 is formed on the second surface 84, and that of the first thermal buffer member 64a and the second thermal buffer member 64b which contacts the surface on which the gate electrode 88 is formed is formed so as to avoid the gate electrode 88 as seen in the laminating direction of the arm series circuit 30.

Accordingly, space in the laminating direction can be formed with respect to the gate electrode 88, so that the signal terminals 90, 94 can be attached to the gate electrode 88. Therefore, the signal terminals 90, 94 can be easily attached to the gate electrode 88 as compared to the case where the top surfaces of the first thermal buffer member 64a and the second thermal buffer member 64b are formed so as not to avoid the gate electrode 88 as seen in the laminating direction of the arm series circuit 30.

According to the embodiment, the third thermal buffer member 64c is disposed between the output terminal plate 54 and the upper diode 36, the fourth thermal buffer member 64d is disposed between the negative-electrode terminal plate 52 and the lower diode 42, the linear expansion coefficient of the third thermal buffer member 64c is greater than that of the upper diode 36, and smaller than that of the output terminal plate 54, and the linear expansion coefficient of the fourth thermal buffer member 64d is greater than that of the lower diode 42, and smaller than that of the negative-electrode terminal plate 52. This can permit the entire arm series circuit 30 to relax the concentration of thermal stress at the individual connected portions, thus making it easier to prevent the inverter 16 from being broken by the thermal stress.

II. Modifications

The disclosure is not limited to the foregoing embodiment, and may of course take various other configurations based on the contents of the disclosure. For example, the disclosure may take the following configurations.

A. Inverter 16 and Drive System 10

Figure 6:
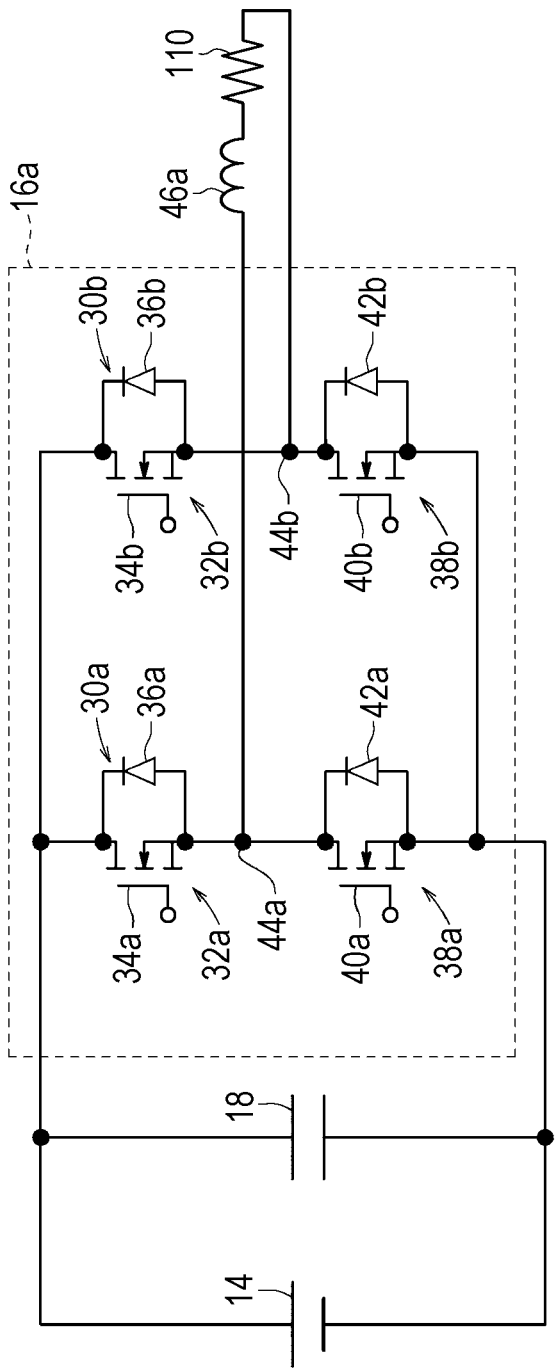
FIG. 6 is a circuit diagram of a circuit in which an inverter as a semiconductor device according to a first modification is mounted.

According to the embodiment, the 3-phase bridge type inverters 16 are used, which is not restrictive as long as the inverter includes a single-phase or multi-phase arm series circuit 30 in which an upper arm and a lower arm each having a switching device and an inversely parallel diode are connected in series. As shown in FIG. 6, for example, the disclosure may be applied to a single-phase bridge type inverter 16a. The inverter 16a in FIG. 6 converts DC power from the DC power supply 14 to AC power, and supplies the AC power to a winding 46a (load) and a resistor 110.

The inverter 16a has two arm series circuits 30a, 30b. The arm series circuit 30a includes an upper arm 32a having a switching device 34a (hereinafter referred to as "upper SW device 34a") and an inversely parallel diode 36a (hereinafter referred to as "upper diode 36a"), and a lower arm 38a having a switching device 40a (hereinafter referred to as "lower SW device 40a") and an inversely parallel diode 42a (hereinafter referred to as "upper diode 42a"). Likewise, the arm series circuit 30b includes an upper arm 32b having a switching device 34b (hereinafter referred to as "upper SW device 34b") and an inversely parallel diode 36b (hereinafter referred to as "upper diode 36b"), and a lower arm 38b having a switching device 40b (hereinafter referred to as "lower SW device 40b") and an inversely parallel diode 42b (hereinafter referred to as "upper diode 42b").

In the inverter 16a, the use of the first to fourth thermal buffer members 64a to 64d sets the output terminal plate 54 apart from the ground GND (first heat sink 60 and second heat sink 62), so that the stray capacitors C21, C22 at of central points 44a, 44b can be reduced, thus suppressing conduction noise and radiation noise. In addition, the first to fourth thermal buffer members 64a to 64d can relax the concentration of thermal stress, thus making it easier to prevent the inverter 16a from being broken by the thermal stress.

Although application of the disclosure to the inverter 16, 16a has been discussed in the foregoing description of the embodiment and the modification, the application is not restrictive, and the disclosure may be applied to any semiconductor device that has a single-phase or multi-phase arm series circuit in which an upper arm and a lower arm each having a switching device and an inversely parallel diode are connected in series. For example, the disclosure may be applied to a boosting/step-down and chopper type DC/DC converter (see, for example, FIGS. 1 and 9 of Japanese Unexamined Patent Application Publication No. 2009-153343, the entire contents of which are incorporated herein by reference).

Although the motor 12 of the drive system 10 is used for driving a vehicle or for electric power steering, for example, according to the embodiment, the application of the motor 12 is not restrictive, and may be applied to a structure which generates the stray capacitance C2 at the central points 44 of the upper arm 32 and the lower arm 38, or a structure which has a problem of thermal stress in the arm series circuit 30. For example, the motor may be used in a laundry machine, a cleaner, an air conditioner, a refrigerator, an electromagnetic range, an AC servo, a railway vehicle, and an elevator.

Although the drive system 10 drives the motor 12 according to the embodiment, the application of the drive system 10 is not restrictive, and may be applied to a structure which generates the stray capacitance C2 at the central points 44 of the upper arm 32 and the lower arm 38, or a structure which has a problem of thermal stress in the arm series circuit 30. For example, the drive system 10 may be used for an inverter in an uninterruptible power supply, and a power conditioner for photovolatic power generation or wind power generation (see, for example, FIG. 4 of Japanese Unexamined Patent Application Publication No. 2011-103497, the entire contents of which are incorporated herein by reference).

B. First to Fourth Thermal Buffer Members 64a to 64d

Although the first thermal buffer member 64a is disposed between the upper SW device 34 and the output terminal plate 54 according to the embodiment, the location is not restrictive. For example, the first thermal buffer member 64a may be disposed both between the upper SW device 34 and the positive-electrode terminal plate 50, and between the upper SW device 34 and the output terminal plate 54 (i.e., two first thermal buffer members 64a may be provided in the laminating direction of the arm series circuit 30). The same is applied to the second to fourth thermal buffer members 64b to 64d.

Figure 7:
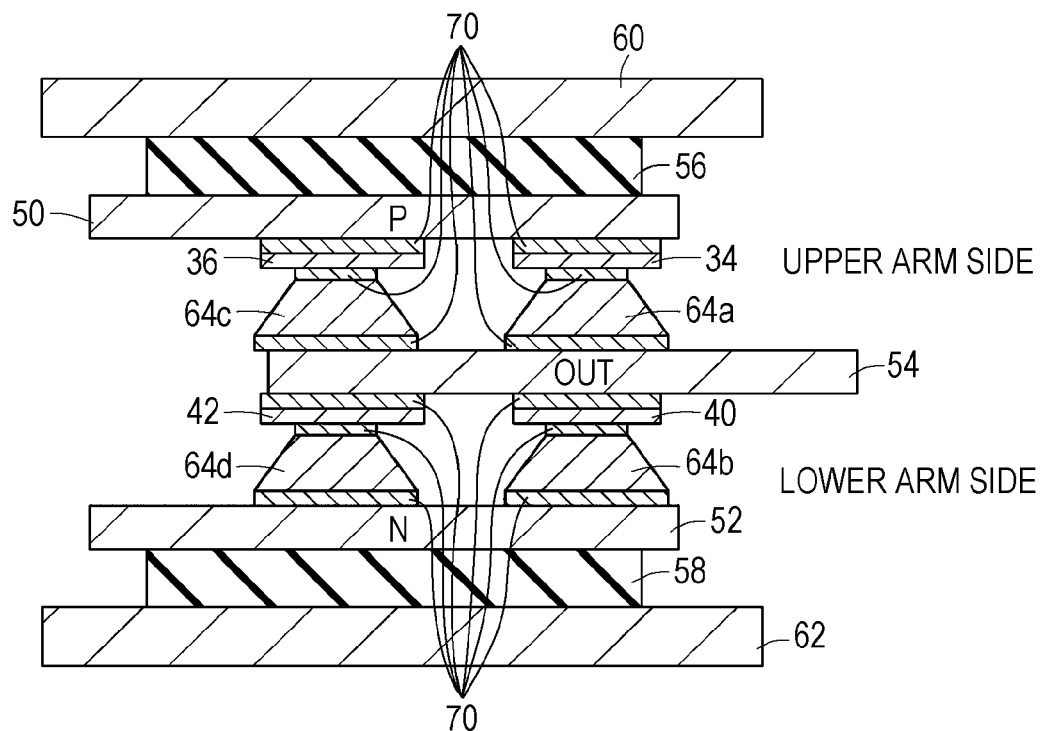
FIG. 7 is a simple cross-sectional view showing one arm series circuit included in an inverter as a semiconductor device according to a second modification, and the periphery of the arm series circuit.
Figure 8:
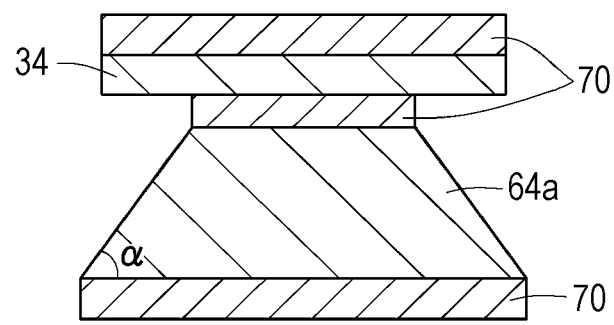
FIG. 8 is a partly enlarged cross-sectional view of the arm series circuit in FIG. 7.

Although the first to fourth thermal buffer members 64a to 64d are rectangular parallelepipeds according to the embodiment, the first to fourth thermal buffer members 64a to 64d are not limited to this shape. For example, the first to fourth thermal buffer members 64a to 64d may each be formed into a quadrangular pyramid frustum shape as in the arm series circuit 30 of an inverter 16b according to a second modification as shown in FIGS. 7 and 8. In this case, the first thermal buffer member 64a has a portion that expands toward the output terminal plate 54 from the upper SW device (portion whose cross-sectional area becomes larger toward the output terminal plate 54). This makes it easier to attach the signal terminal 90 as compared to a case of a rectangular parallelepiped (columnar body) having the same bottom surface size and height as the first thermal buffer member 64a in FIG. 7. In addition, the second modification can bring about an effect of heat diffusion as compared to a case of a rectangular parallelepiped (columnar body) having the same top surface size and height as the first thermal buffer member 64a in FIG. 7. To obtain the heat diffusion effect, it is preferable that the angle formed by each side surface and the bottom surface of the first thermal buffer member 64a of a quadrangular pyramid frustum shape in FIG. 8 (e.g., angle α in FIG. 8) should take a value within a range of 20° or greater and less than 90°. A similar advantage can be obtained for the second thermal buffer member 64b in FIGS. 7 and 8. In addition, the third and fourth thermal buffer members 64c, 64d in FIGS. 7 and 8 can also provide the heat diffusion effect.

Figure 9:
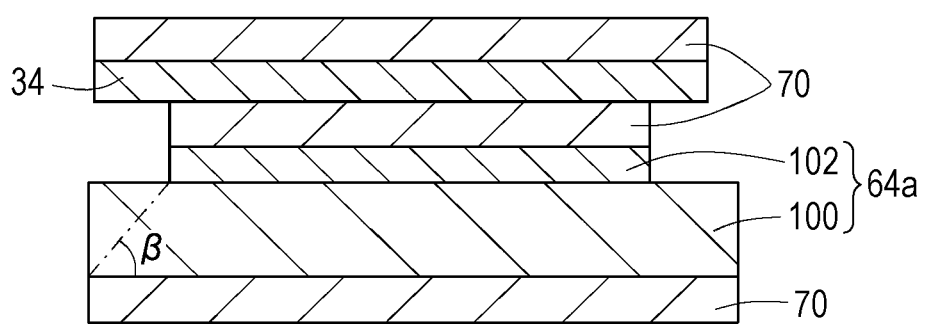
FIG. 9 is a partly enlarged cross-sectional view of one arm series circuit included in an inverter as a semiconductor device according to a third modification.

The shape of the first thermal buffer member 64a may take the shape of two rectangular parallelepipeds combined as in the arm series circuit 30 of an inverter 16c according to a third modification which is partly shown in FIG. 9. Specifically, the first thermal buffer member 64a in FIG. 9 has a rectangular parallelepiped 100 which is disposed on the output terminal plate 54 side and is relatively large, and a rectangular parallelepiped 102 which is disposed on the upper SW device 34 side and is relatively small. The rectangular parallelepiped 100 is larger than the rectangular parallelepiped 102 in all of the vertical size, the horizontal size and the height. Such a structure can also make the attachment of the signal terminal 90 easier and can provide the heat diffusion effect as achieved by the structure shown in FIGS. 7 and 8. To obtain the heat diffusion effect, it is preferable that the angle formed by a line connecting the edge of the bottom surface of the rectangular parallelepiped 100 in FIG. 9 and the edge of the bottom surface of the rectangular parallelepiped 102 in FIG. 9, and the bottom surface of the rectangular parallelepiped 100 (e.g., angle β in FIG. 9) should take a value within a range of 20° or greater and less than 90°. The second to fourth thermal buffer members 64b to 64d may take similar structures.

Although four thermal buffer members (namely, first to fourth thermal buffer members 64a to 64d) are provided according to the embodiment (FIG. 3) and the individual modifications, there may be a feasible structure where thermal buffer members (first and second thermal buffer members 64a, 64b) are provided only in the upper SW device 34 and the lower SW device 40, and thermal buffer members (third and fourth thermal buffer members 64c, 64d) are not provided in the upper diode 36 and the lower diode 42. To achieve such a structure, the thicknesses (vertical direction in FIG. 3) of the upper diode 36 and the lower diode 42 may be set greater than those of the upper SW device 34 and the lower SW device 40, so that the thermal buffer members can be provided at the spaces provided by the differences. Alternatively, the positive-electrode terminal plate 50 and the negative-electrode terminal plate 52 may be bent away from the output terminal plate 54 at positions corresponding to the upper SW device 34 and the lower SW device 40, thereby providing spaces for disposing the thermal buffer members. It is also possible to provide a structure where thermal buffer members (third and fourth thermal buffer members 64c, 64d) are provided only in the upper diode 36 and the lower diode 42, and thermal buffer members (first and second thermal buffer members 64a, 64b) are not provided in the upper SW device 34 and the lower SW device 40.

Although according to the embodiment, the first to fourth thermal buffer members 64a to 64d have identical or similar shapes in the embodiment (FIG. 3) and the individual modifications, the shapes may be designed significantly different from one another. For example, the first and second thermal buffer members 64a, 64b may have quadrangular pyramid frustum shapes, and the third and fourth thermal buffer members 64c, 64d may have rectangular parallelepipeds. It is to be noted however that the first and second thermal buffer members 64a, 64b should have the same shape, or the third and fourth thermal buffer members 64c, 64d should have the same shape.

Depending on the case, only one of the first and second thermal buffer members 64a, 64b may be provided. Likewise, depending on the case, only one of the third and fourth thermal buffer members 64c, 64d may be provided.

According to an aspect of an exemplary embodiment of the disclosure, there is provided a semiconductor device including at least one arm series circuit including an upper arm having a first switching device and a first diode connected in inversely parallel thereto, a lower arm having a second switching device and a second diode connected in inversely parallel thereto, a positive-electrode terminal, a negative-electrode terminal, and an output terminal disposed between the positive-electrode terminal and the negative-electrode terminal, the upper arm and the lower arm being connected in series, the first switching device and the first diode being disposed between the positive-electrode terminal and the output terminal, the second switching device and the second diode being disposed between the negative-electrode terminal and the output terminal, a ground being disposed on an opposite side of each of the positive-electrode terminal and the negative-electrode terminal to the output terminal via a first insulating substrate; a conductive first thermal buffer member disposed between at least one of the positive-electrode terminal and the output terminal, and the first switching device, the first thermal buffer member having a linear expansion coefficient greater than a linear expansion coefficient of the first switching device, and smaller than a linear expansion coefficient of the positive-electrode terminal or the output terminal; and a conductive second thermal buffer member disposed between at least one of the negative-electrode terminal and the output terminal, and the second switching device, the second thermal buffer member having a linear expansion coefficient greater than a linear expansion coefficient of the second switching device, and smaller than a linear expansion coefficient of the negative-electrode terminal or the output terminal.

According to the disclosure, the first thermal buffer member is disposed between at least one of the positive-electrode terminal and the output terminal, and the first switching device. This increases the distance between the first switching device and the ground on the first switching device side by the thickness of the first thermal buffer member. As a result, the stray capacitor between the output terminal and the ground on the first switching device side can be reduced. This makes it possible to reduce the common-mode current originating from the stray capacitor, thereby suppressing conduction noise and radiation noise originating from the common-mode current.

Likewise, the second thermal buffer member is disposed between at least one of the negative-electrode terminal and the output terminal, and the second switching device. This increases the distance between the second switching device and the ground on the second switching device side by the thickness of the second thermal buffer member. As a result, the stray capacitor between the output terminal and the ground on the second switching device side can be reduced. This makes it possible to reduce the common-mode current originating from the stray capacitor, thereby suppressing conduction noise and radiation noise originating from the common-mode current.

According to the disclosure, the linear expansion coefficient of the first thermal buffer member is greater than the linear expansion coefficient of the first switching device, and is smaller than the linear expansion coefficient of the positive-electrode terminal or the output terminal. Accordingly, when the first switching device generates heat, it is possible to relax the concentration of thermal stress which occurs at the connected portion of the first switching device and the positive-electrode terminal or the output terminal due to the difference between the linear expansion coefficients of the first switching device and the positive-electrode terminal or the output terminal. This makes it easier to prevent the semiconductor device from being broken by the thermal stress.

Likewise, the linear expansion coefficient of the second thermal buffer member is greater than the linear expansion coefficient of the second switching device, and is smaller than the linear expansion coefficient of the negative-electrode terminal or the output terminal. Accordingly, when the second switching device generates heat, it is possible to relax the concentration of thermal stress which occurs at the connected portion of the second switching device and the negative-electrode terminal or the output terminal due to the difference between the linear expansion coefficients of the second switching device and the negative-electrode terminal or the output terminal. This makes it easier to prevent the semiconductor device from being broken by the thermal stress.

Each of the first switching device and the second switching device may have a positive electrode formed on a first surface, a negative electrode formed on a second surface opposite to the first surface, and a control electrode formed on the first surface or the second surface, and that of the first thermal buffer member and the second thermal buffer member which contacts the surface on which the control electrode is formed may be formed so as to avoid the control electrode as seen in a laminating direction of the arm series circuit.

Accordingly, space in the laminating direction can be formed with respect to the control electrode, so that a connecting member (wire bonding, bus bar or the like) can be attached to the control electrode through the space. Therefore, the connecting member can be easily attached to the control electrode as compared to the case where that of the first thermal buffer member and the second thermal buffer member which contacts the surface on which the control electrode is formed is formed so as not to avoid the control electrode as seen in the laminating direction.

The ground may include a heat sink, and each of the first thermal buffer member and the second thermal buffer member may have an enlarged portion whose cross-sectional area increases in a direction of separation from an associated one of the first switching device and the second switching device to which the first thermal buffer member and the second thermal buffer member are respectively connected.

This configuration makes it easier to diffuse heat generated in the first switching device or the second switching device in the direction of separation. Therefore, reduction in heat radiation property can be suppressed as compared to the case where the cross-sectional area of the surface to which the first switching device or the second switching device is connected is set identical in the direction of separation (in case of a cylindrical shape). This advantage is particularly effective when the case where that of the first thermal buffer member and the second thermal buffer member which contacts the surface on which the control electrode is formed is formed so as to avoid the control electrode as seen in the laminating direction of the arm series circuit.

A conductive third thermal buffer member may be disposed between at least one of the positive-electrode terminal and the output terminal, and the first diode, a conductive fourth thermal buffer member may be disposed between at least one of the negative-electrode terminal and the output terminal, and the second diode, the third thermal buffer member may have a linear expansion coefficient greater than a linear expansion coefficient of the first diode, and smaller than a linear expansion coefficient of the positive-electrode terminal or the output terminal, and the fourth thermal buffer member may have a linear expansion coefficient greater than a linear expansion coefficient of the second diode, and smaller than a linear expansion coefficient of the negative-electrode terminal or the output terminal.

Accordingly, it is possible to relax the concentration of thermal stress at each connected portion in the entire arm series circuit, making it easier to prevent the semiconductor device from being broken by the thermal stress.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device comprising:
at least one arm series circuit comprising:
an upper arm having a first switching device and a first diode connected to and provided in inversely parallel with the first switching device;
a lower arm having a second switching device and a second diode connected to and provided in inversely parallel with the second switching device, the lower arm being connected in series with the upper arm;
a positive-electrode terminal;
a negative-electrode terminal; and
an output terminal disposed between the positive-electrode terminal and the negative-electrode terminal, the first switching device and the first diode being disposed between the positive-electrode terminal and the output terminal, the second switching device and the second diode being disposed between the negative-electrode terminal and the output terminal;
a conductive first thermal buffer member disposed between the first switching device and at least one of the positive-electrode terminal and the output terminal, the first thermal buffer member having a linear expansion coefficient greater than a linear expansion coefficient of the first switching device and smaller than a linear expansion coefficient of one of the positive-electrode terminal and the output terminal; and
a conductive second thermal buffer member disposed between the second switching device and at least one of the negative-electrode terminal and the output terminal, the second thermal buffer member having a linear expansion coefficient greater than a linear expansion coefficient of the second switching device and smaller than a linear expansion coefficient of one of the negative-electrode terminal and the output terminal.

2. The semiconductor device according to claim 1,
wherein each of the first switching device and the second switching device has a first surface, a second surface opposite to the first surface, a positive electrode provided on the first surface, a negative electrode provided on the second surface, and a control electrode provided on one of the first surface and the second surface, and
wherein if one of the first surface and the second surface on which the control electrode is provided is defined as a contacting surface, one of the first thermal buffer member and the second thermal buffer member which contacts the contacting surface is provided to avoid the control electrode as seen in a laminating direction of the arm series circuit.

3. The semiconductor device according to claim 1, further comprising:
a first ground disposed on an opposite side of the output terminal with respect to the positive-electrode terminal;
a second ground disposed on an opposite side of the output terminal with respect to the negative-electrode terminal;
a first insulating substrate provided between the first ground and the positive-electrode terminal; and
a second insulating substrate provided between the second ground and the negative-electrode terminal.

4. The semiconductor device according to claim 3,
wherein each of the first and second grounds includes a heat sink, and
wherein the first thermal buffer member has a first enlarged portion, and the second thermal buffer member has a second enlarged portion, cross-sectional area of the first enlarged portion increasing as being farther from the first switching device to which the first thermal buffer member is connected, cross-sectional area of the second enlarged portion increasing as being farther from the second switching device to which the second thermal buffer member is connected.

5. The semiconductor device according to claim 1,
wherein the first thermal buffer member is disposed between the output terminal and the first switching device.

6. The semiconductor device according to claim 5,
wherein the second thermal buffer member is disposed between the negative-electrode terminal and the second switching device.

7. The semiconductor device according to claim 1,
wherein the second thermal buffer member is disposed between the negative-electrode terminal and the second switching device.

8. The semiconductor device according to claim 1,
wherein the linear expansion coefficient of the first thermal buffer member is smaller than the linear expansion coefficient of each of the positive-electrode terminal and the output terminal.

9. The semiconductor device according to claim 8,
wherein the linear expansion coefficient of the second thermal buffer member is smaller than the linear expansion coefficient of each of the negative-electrode terminal and the output terminal.

10. The semiconductor device according to claim 1,
wherein the linear expansion coefficient of the second thermal buffer member is smaller than the linear expansion coefficient of each of the negative-electrode terminal and the output terminal.

11. The semiconductor device according to claim 1, further comprising:
a conductive third thermal buffer member disposed between at least one of the positive-electrode terminal and the output terminal, and the first diode; and
a conductive fourth thermal buffer member disposed between at least one of the negative-electrode terminal and the output terminal, and the second diode,
wherein the third thermal buffer member has a linear expansion coefficient greater than a linear expansion coefficient of the first diode and smaller than a linear expansion coefficient of one of the positive-electrode terminal and the output terminal, and
wherein the fourth thermal buffer member has a linear expansion coefficient greater than a linear expansion coefficient of the second diode and smaller than a linear expansion coefficient of one of the negative-electrode terminal and the output terminal.

12. The semiconductor device according to claim 11,
wherein the third thermal buffer member is disposed between the output terminal and the first diode.

13. The semiconductor device according to claim 12,
wherein the fourth thermal buffer member is disposed between the negative-electrode terminal and the second diode.

14. The semiconductor device according to claim 11,
wherein the fourth thermal buffer member is disposed between the negative-electrode terminal and the second diode.

15. The semiconductor device according to claim 11,
wherein the linear expansion coefficient of the third thermal buffer member is smaller than the linear expansion coefficient of each of the positive-electrode terminal and the output terminal.

16. The semiconductor device according to claim 15,
wherein the linear expansion coefficient of the fourth thermal buffer member is smaller than the linear expansion coefficient of each of the negative-electrode terminal and the output terminal.

17. The semiconductor device according to claim 11,
wherein the linear expansion coefficient of the fourth thermal buffer member is smaller than the linear expansion coefficient of each of the negative-electrode terminal and the output terminal.

* * * * *